(12) United States Patent
Yonehara et al.

(10) Patent No.: US 9,425,431 B2
(45) Date of Patent: Aug. 23, 2016

(54) ORGANIC ELECTROLUMINESCENT ELEMENT AND LIGHT EMITTING DEVICE WITH LIGHT EXTRACTION PORTIONS

(71) Applicant: KABUSHIKI KAISHA TOSHIBA, Tokyo (JP)

(72) Inventors: Toshiya Yonehara, Fukuoka (JP); Tomio Ono, Kanagawa (JP); Tomoaki Sawabe, Tokyo (JP); Shintaro Enomoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/638,067

(22) Filed: Mar. 4, 2015

(65) Prior Publication Data

US 2015/0179982 A1    Jun. 25, 2015

Related U.S. Application Data

(63) Continuation of application No. PCT/JP2013/005595, filed on Sep. 20, 2013.

(30) Foreign Application Priority Data

Sep. 24, 2012  (JP) .................................. 2012-210190

(51) Int. Cl.
*H01L 51/52*  (2006.01)

(52) U.S. Cl.
CPC ........ *H01L 51/5275* (2013.01); *H01L 51/5234* (2013.01); *H01L 51/5268* (2013.01); *H01L 51/5271* (2013.01)

(58) Field of Classification Search
CPC ............ H01L 51/5275; H01L 51/5268; H01L 51/5271; H01L 51/5234
See application file for complete search history.

(56) References Cited

U.S. PATENT DOCUMENTS 6,660,411 B2  12/2003  Sato et al.
6,833,667 B2  12/2004  Hamano et al.
(Continued)

FOREIGN PATENT DOCUMENTS

EP  1 734 792        12/2006
EP     1734792 A1 *  12/2006  .......... H01L 51/5206
(Continued)

OTHER PUBLICATIONS

Notification of Reason(s) for Refusal issued by the Japanese Patent Office on Mar. 9, 2015, for Japanese Patent Application No. 2012-210190, and English-language translation thereof.
(Continued)

*Primary Examiner* — John P Dulka
(74) *Attorney, Agent, or Firm* — Finnegan, Henderson, Farabow, Garrett & Dunner LLP

(57) ABSTRACT

According to one embodiment, an organic electroluminescent element includes a first electrode, a reflective layer provided opposite to the first electrode, an organic light emitting layer provided between the first electrode and the reflective layer, a second electrode provided between the organic light emitting layer and the reflective layer, an optical buffer layer provided between the second electrode and the reflective layer, and a plurality of light extraction portions. The plurality of light extraction portions are provided between the second electrode and the organic light emitting layer. The plurality of light extraction portions are projected from the side provided with the second electrode of the optical buffer layer into the optical buffer layer. The light extraction portions have a refractive index different from a refractive index of the optical buffer layer.

14 Claims, 21 Drawing Sheets

(56) References Cited

U.S. PATENT DOCUMENTS

| | | |
|---|---|---|
| 7,012,368 B2 | 3/2006 | Kim |
| 2004/0211971 A1 | 10/2004 | Takei et al. |
| 2006/0065904 A1 | 3/2006 | Uemura et al. |
| 2006/0108580 A1 | 5/2006 | Yoshida et al. |
| 2006/0158110 A1 | 7/2006 | Kim et al. |
| 2008/0012471 A1* | 1/2008 | Cok .................... B82Y 10/00 313/503 |
| 2008/0203908 A1 | 8/2008 | Hasegawa et al. |
| 2008/0272689 A1 | 11/2008 | Ide et al. |
| 2009/0224660 A1 | 9/2009 | Nakanishi et al. |
| 2010/0194717 A1 | 8/2010 | Mori et al. |
| 2011/0180835 A1 | 7/2011 | Ono et al. |
| 2012/0056231 A1 | 3/2012 | Boerner et al. |
| 2012/0229020 A1 | 9/2012 | Yonehara et al. |
| 2012/0235197 A1 | 9/2012 | Okuyama |
| 2012/0286255 A1 | 11/2012 | Tanaka |

FOREIGN PATENT DOCUMENTS

| | | | |
|---|---|---|---|
| EP | 2 214 223 | 8/2010 | |
| EP | 2214223 A2 * | 8/2010 | .......... H01L 51/5268 |
| EP | 2 498 580 | 9/2012 | |
| EP | 2498580 A1 * | 9/2012 | .......... H01L 51/5072 |
| JP | 2000-12235 | 1/2000 | |
| JP | 2002-110361 | 4/2002 | |
| JP | 2003-332067 | 11/2003 | |
| JP | 2006-92936 | 4/2006 | |
| JP | 2006-147521 | 6/2006 | |
| JP | 2008-210665 | 9/2008 | |
| JP | 2009-216862 | 9/2009 | |
| JP | 2010-182449 | 8/2010 | |
| JP | 2011-155002 | 8/2011 | |
| JP | 2011-233288 | 11/2011 | |
| JP | 2012-109262 | 6/2012 | |
| KR | 10-2011-0134174 | 12/2011 | |
| TW | I261484 | 9/2006 | |
| TW | I279750 | 4/2007 | |
| TW | 201106773 A1 | 2/2011 | |
| TW | 201238109 A1 | 9/2012 | |
| WO | WO 2011/016086 | 2/2011 | |

OTHER PUBLICATIONS

Takao Goto et al., "Optical Analysis of Surface-Plasmon Loss in OLED with Multi-Cathode Structure", Japan Society of Applied Physics, $59^{th}$ (2012), p. 12-277.

Japanese Office Action issued Dec. 19, 2014, in the counterpart JP Application No. 2012-210190, 6 pages.

International Search Report and Written Opinion from the European Patent Office in International Application No. PCT/JP2013/005595, dated Feb. 21, 2014, 13 pages.

Office Action issued by the Taiwanese Intellectual Property Office on Aug. 28, 2015, for Taiwanese Patent Application No. 102134297, and English-language translation thereof.

Notice of Preliminary Rejection issued by the Korean Intellectual Property Office on Dec. 1, 2015, for Korean Patent Application No. 10-2015-7006831, and English-language translation thereof.

* cited by examiner (c)

ORGANIC ELECTROLUMINESCENT ELEMENT AND LIGHT EMITTING DEVICE WITH LIGHT EXTRACTION PORTIONS

CROSS-REFERENCE TO RELATED APPLICATIONS

This application is based upon and claims the benefit of priority from Japanese Patent Application No. 2012-210190, filed on Sep. 24, 2012, and PCT Patent Application PCT/JP2013/005595, filed on Sep. 20, 2013; the entire contents of which are incorporated herein by reference.

FIELD

Embodiments described herein relate generally to an organic electroluminescent element and a light emitting device.

BACKGROUND

The organic electroluminescent element includes a cathode electrode, an anode electrode, and an organic light emitting layer provided between the cathode electrode and the anode electrode.

In the organic electroluminescent element, a voltage is applied between the cathode electrode and the anode electrode. Thus, electrons are injected from the cathode electrode into the organic light emitting layer, and holes are injected from the anode electrode into the organic light emitting layer. The injected electrons and holes are recombined, and excitons are generated by the recombination. When the exciton undergoes radiative deactivation, light is generated.

In such an organic electroluminescent element, improvement in light extraction efficiency is desired.

BRIEF DESCRIPTION OF THE DRAWINGS

FIG. 13 is a schematic view illustrating a method for forming a plurality of light extraction portions 80a;

DETAILED DESCRIPTION

Figure 1A:
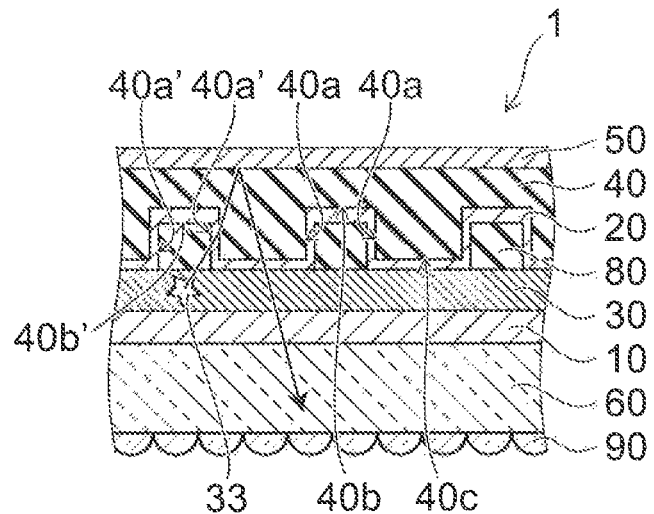
FIGS. 1A and 1B are schematic views illustrating organic electroluminescent elements 1 and 1a according to a first embodiment.

According to one embodiment, an organic electroluminescent element includes a first electrode, a reflective layer provided opposite to the first electrode, an organic light emitting layer provided between the first electrode and the reflective layer, a second electrode provided between the organic light emitting layer and the reflective layer, an optical buffer layer provided between the second electrode and the reflective layer, and a plurality of light extraction portions. The plurality of light extraction portions are provided between the second electrode and the organic light emitting layer. The plurality of light extraction portions are projected from the side provided with the second electrode of the optical buffer layer into the optical buffer layer. The light extraction portions have a refractive index different from a refractive index of the optical buffer layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
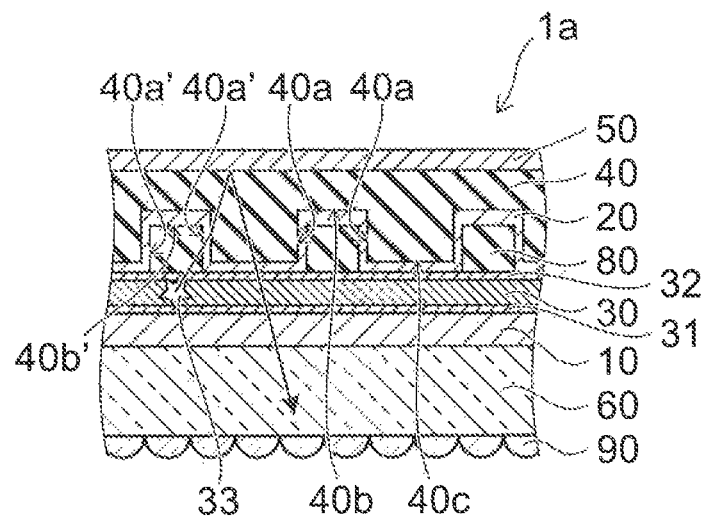

FIGS. 1A and 1B are schematic views illustrating organic electroluminescent elements 1 and 1a according to a first embodiment.

FIG. 1A is a schematic cross-sectional view of the organic electroluminescent element 1. FIG. 1B is a schematic cross-sectional view of the organic electroluminescent element 1a further including a first functional layer 31 and a second functional layer 32.

As shown in FIG. 1A, the organic electroluminescent element 1 includes a first electrode 10, a second electrode 20, an organic light emitting layer 30, an optical buffer layer 40, a reflective layer 50, and a light extraction portion 80.

The first electrode 10 is transmissive to light emitted from the organic light emitting layer 30.

The first electrode 10 functions as e.g. an anode. The thickness dimension of the first electrode 10 can be set to e.g. 50 nanometers (nm) or more.

The first electrode 10 includes e.g. an oxide including at least one element selected from the group consisting of In, Sn, Zn, and Ti. The first electrode 10 is e.g. an ITO (indium tin oxide) film.

The second electrode 20 is provided between the organic light emitting layer 30 and the reflective layer 50. The second electrode 20 is transmissive to light emitted from the organic light emitting layer 30.

The second electrode 20 functions as e.g. a cathode. The thickness dimension of the second electrode 20 can be set to e.g. 10 nanometers (nm) or less.

The material of the second electrode 20 is not particularly limited as long as it is conductive. However, preferably, the material has low refractive index and low extinction coefficient. For instance, the second electrode 20 can be configured to include at least one selected from the group consisting of Ag, Au, Ca, and alkali metal.

For instance, the second electrode 20 may be made of a magnesium silver alloy with the molar fraction of included Ag being 0.4 or more.

Here, the first electrode 10 can be used as a cathode, and the second electrode 20 can be used as an anode.

The organic light emitting layer 30 is provided between the first electrode 10 and the second electrode 20. The organic light emitting layer 30 emits light containing a component of the wavelength of visible light. The thickness dimension of the organic light emitting layer 30 can be set to e.g. 50 nanometers (nm) or more.

The organic light emitting layer 30 includes such as $Alq_3$, F8BT, and PPV. The organic light emitting layer 30 can be made of a mixed material of a host material and a dopant added to the host material. The host material can be based on such as CBP, BCP, TPD, PVK, and PPT. The dopant material can be based on such as Flrpic, $Ir(ppy)_3$, and Flr6.

Furthermore, as shown in FIG. 1B, the organic electroluminescent element 1a can further include a first functional layer 31 and a second functional layer 32.

The first functional layer 31 is provided between the organic light emitting layer 30 and the first electrode 10. The thickness dimension of the first functional layer 31 can be set to e.g. approximately 1 nanometer (nm). The first functional layer 31 is provided as necessary.

The first functional layer 31 functions as e.g. a hole injection layer. The first functional layer 31 functioning as a hole injection layer includes such as PEDPOT:PPS, CuPc, and $MoO_3$.

The first functional layer 31 functions as e.g. a hole transport layer. The first functional layer 31 functioning as a hole transport layer includes such as α-NPD, TAPC, m-MTDATA, TPD, and TCTA.

The first functional layer 31 may be made by stacking a layer functioning as a hole injection layer and a layer functioning as a hole transport layer.

The second functional layer 32 is provided between the organic light emitting layer 30 and the second electrode 20. The thickness dimension of the second functional layer 32 can be set to e.g. approximately 1 nanometer (nm). The second functional layer 32 is provided as necessary.

The second functional layer 32 functions as e.g. an electron transport layer. The second functional layer 32 includes such as $Alq_3$, BAlq, $POPy_2$, Bphen, and 3TPYMB.

Alternatively, the second functional layer 32 functions as e.g. an electron injection layer.

Alternatively, the second functional layer 32 may be made by stacking a layer functioning as an electron transport layer and a layer functioning as an electron injection layer. In this case, the layer functioning as an electron injection layer is intended to improve the electron injection characteristics. The layer functioning as an electron injection layer is provided between the layer functioning as an electron transport layer and the second electrode 20.

The optical buffer layer 40 is provided between the second electrode 20 and the reflective layer 50. Thus, the distance between the organic light emitting layer 30 and the reflective layer 50 can be separated by at least the amount of the thickness dimension of the optical buffer layer 40. As a result, plasmon loss can be reduced.

The thickness dimension of the portion of the optical buffer layer 40 not provided with the light extraction portion 80 can be set to 50 nanometers (nm) or more.

The material of the optical buffer layer 40 is not particularly limited as long as it is transmissive to light emitted from the organic light emitting layer 30. However, the refractive index of the optical buffer layer 40 is different from the refractive index of the light extraction portion 80.

The optical buffer layer 40 has interfaces 40a, 40b, and 40c.

The interface 40a lies along a direction crossing the extending direction (the direction perpendicular to the page in FIGS. 1A and 1B) of the surface of the organic light emitting layer 30 on the side provided with the second electrode 20.

In the illustrated example, the extending direction of the surface of the organic light emitting layer 30 on the side provided with the second electrode 20 is orthogonal to the extending direction of the interface 40a. However, the extending direction is not limited thereto. The extending direction of the surface of the organic light emitting layer 30 on the side provided with the second electrode 20 only needs to be non-parallel to the extending direction of the interface 40a.

The interface 40b lies along the extending direction of the surface of the organic light emitting layer 30 on the side provided with the second electrode 20.

The interface 40c is an interface in the region not provided with the light extraction portion 80.

The details on the reduction of plasmon loss, the refractive index of the optical buffer layer 40, the thickness dimension of the optical buffer layer 40, and refraction at the interfaces 40a, 40b, and 40c will be described later.

The reflective layer 50 is provided on the opposite side of the optical buffer layer 40 from the side provided with the second electrode 20. That is, the reflective layer 50 is provided opposite to the first electrode 10. The reflective layer 50 is reflective to light emitted from the organic light emitting layer 30. The thickness dimension of the reflective layer 50 can be set to e.g. approximately 100 nanometers (nm).

The reflective layer 50 can include e.g. a metal such as Ag, Mg:Ag (magnesium silver alloy), and Al. Alternatively, the reflective layer 50 can be e.g. a dielectric multilayer film.

The light extraction portion 80 is provided in a plurality on the side provided with the second electrode 20 of the optical buffer layer 40. The light extraction portion 80 has a refractive index different from the refractive index of the optical buffer layer 40. More specifically, a plurality of light extraction portions 80 are provided between the second electrode 20 and the organic light emitting layer 30. The light extraction portion 80 is projected from the side provided with the second electrode 20 of the optical buffer layer 40 into the optical buffer layer 40. By the provision of the light extraction portion 80, the interfaces 40a and 40b are formed in the optical buffer layer 40.

The shape of the light extraction portion 80 is not particularly limited as long as at least the interface 40a is formed in the optical buffer layer 40. For instance, the light extraction portion 80 may be shaped like a mesh, line, or dot. In the illustrated example, the cross-sectional shape of the light extraction portion 80 is rectangular. However, the cross-sectional shape is not limited thereto. For instance, the cross-sectional shape of the light extraction portion 80 can be an arbitrary shape such as a triangle, trapezoid, semicircle, and semiellipse.

The organic electroluminescent element 1, 1a illustrated in FIGS. 1A and 1B includes a substrate 60 on the opposite side of the first electrode 10 from the side provided with the organic light emitting layer 30. That is, the first electrode 10 is provided between the substrate 60 and the organic light emitting layer 30. The substrate 60 is transmissive to light emitted from the organic light emitting layer 30. The substrate 60 is e.g. a glass substrate.

The organic electroluminescent element 1, 1a is an organic electroluminescent element of the bottom emission type. The intensity of the light passing through the substrate 60 of the light emitted from the organic light emitting layer 30 is higher than the intensity of the light passing through the reflective layer 50 of the light emitted from the organic light emitting layer 30. The light emitted from the organic light emitting layer 30 is extracted primarily from the first electrode 10 side (substrate 60 side).

Furthermore, the organic electroluminescent element 1, 1a includes a plurality of microlenses 90 on the surface of the substrate 60 on the opposite side from the side provided with the first electrode 10. For instance, the microlens 90 can be shaped like a hemisphere. The height dimension (the length along the thickness direction of the substrate 60) of the microlens 90 can be set to e.g. 1 micrometer or more and 50 micrometers or less. In this case, the diameter dimension of the microlens 90 is 2 micrometers or more and 100 micrometers or less. However, the shape and dimension of the microlens 90 are not limited to those illustrated, but can be appropriately changed. In the case where a plurality of microlenses 90 are provided on the substrate 60, a microlens sheet with a plurality of microlenses 90 arranged like a matrix can be formed in advance, and then affixed to the substrate 60.

The interface 40a' of the second electrode 20 is a surface in contact with the second electrode 20, and is opposed to the interface 40a of the optical buffer layer 40. The interface 40b' of the second electrode 20 is a surface in contact with the second electrode 20, and is opposed to the interface 40b of the optical buffer layer 40.

Next, the aforementioned reduction of plasmon loss is further described.

Figure 2A:
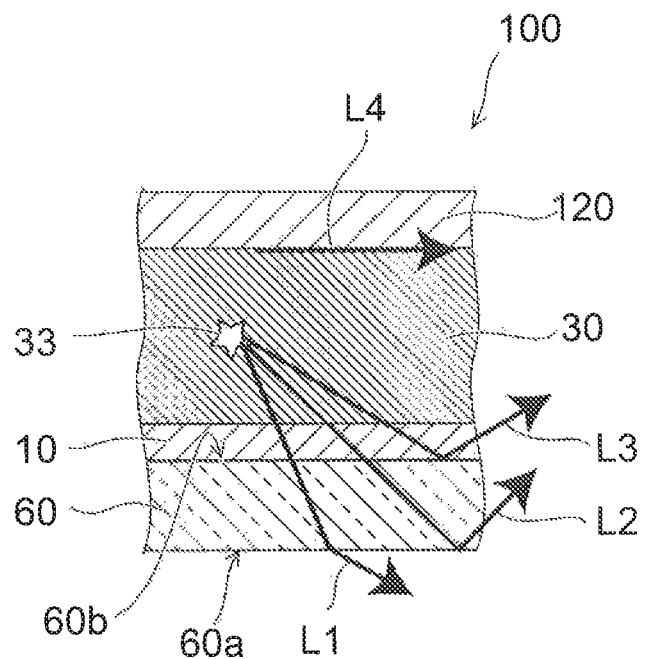
FIGS. 2A and 2B are schematic views illustrating the loss of light generated at a light emitting position 33 in the organic light emitting layer 30 provided in an organic electroluminescent element 100 according to a comparative example.
Figure 2B:
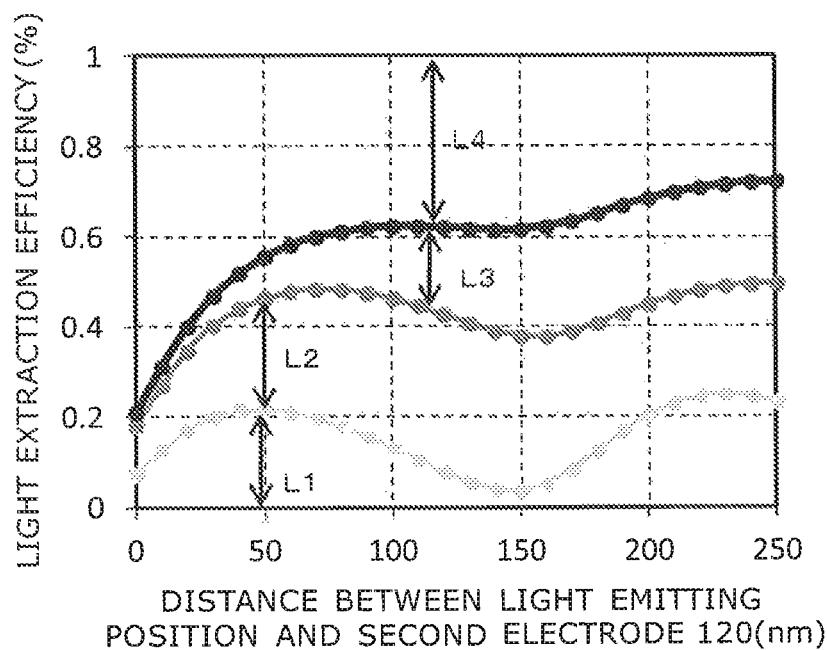

FIGS. 2A and 2B are schematic views illustrating the loss of light generated at a light emitting position 33 in the organic light emitting layer 30 provided in an organic electroluminescent element 100 according to a comparative example.

Here, FIG. 2A is a schematic cross-sectional view illustrating the trace of light generated at the light emitting position 33 in the organic light emitting layer 30. FIG. 2B is a graph illustrating the partition ratio for each optical mode. FIG. 2B shows an example simulation result for light extraction efficiency. The horizontal axis of FIG. 2B represents the distance from the light emitting position 33 to the second electrode 120. The vertical axis of FIG. 2B represents the light extraction efficiency. The condition of the simulation was set as follows. The first electrode 10 was assumed to be made of ITO. For the first electrode 10, the refractive index was set to 1.8 to 2.2, and the thickness dimension was set to 110 nanometers (nm). The refractive index of the organic light emitting layer 30 was set to 1.9. The thickness dimension of the organic light emitting layer 30 was given by adding 80 nanometers (nm) to each distance from the light emitting position 33 to the second electrode 120 (each distance on the horizontal axis of FIG. 2B). The second electrode 120 was assumed to be made of Al. The thickness dimension of the second electrode 120 was set to 150 nanometers (nm). The refractive index of the substrate 60 was set to 1.5. The wavelength of light generated at the light emitting position 33 in the organic light emitting layer 30 was set to 525 nanometers (nm).

As shown in FIG. 2A, the organic electroluminescent element 100 according to the comparative example includes a first electrode 10, a second electrode 120 made of metal, an organic light emitting layer 30, and a substrate 60. That is, the organic electroluminescent element 100 according to the comparative example has the configuration of a typical organic electroluminescent element. Thus, the organic electroluminescent element 100 according to the comparative example does not include the optical buffer layer 40, the reflective layer 50, and the light extraction portion 80 mentioned above. Furthermore, the second electrode 120 is not transmissive to light emitted from the organic light emitting layer 30.

As shown in FIG. 2A, in the organic electroluminescent element 100, traces of light generated at the light emitting position 33 in the organic light emitting layer 30 are broadly classified into four types. The light generated at the light emitting position 33 includes an external mode component L1, a substrate mode component L2, a thin film layer mode component L3, and a loss component L4 in the second electrode 120 made of metal. In the following, the "loss component L4 in the second electrode 120 made of metal" is simply referred to as "loss component L4".

The external mode component L1 is a component that can be extracted to the outside of the organic electroluminescent element 100. The substrate mode component L2 is a component reaching the substrate 60 but totally reflected at the interface between the substrate 60 and outside air. The thin film layer mode component L3 is a component reaching the first electrode 10 but totally reflected at the interface between the first electrode 10 and the substrate 60. In this case, the substrate mode component L2 can be extracted to the outside from a surface of the substrate 60 other than the surface 60a and the surface 60b, such as from a surface crossing the surface 60a or the surface 60b. Likewise, the thin film layer mode component L3 can also be extracted to the outside from the first electrode 10. That is, the external mode component L1, the substrate mode component L2, and the thin film layer mode component L3 are components that can be extracted to the outside.

In contrast, the loss component L4 is a component lost by the second electrode 120 made of metal.

Here, the light incident on the second electrode 120 includes propagating light and non-propagating light.

The propagating light and the non-propagating light are components of light emitted from the organic light emitting layer 30.

The propagating light is light that could propagate to infinity in an absorption-free medium.

The non-propagating light is light with the intensity attenuated exponentially with the propagation distance.

In the case where a boundary with different refractive indices exists between the light emitting position 33 and the second electrode 120, part of the propagating light may turn to non-propagating light by total reflection and reach the second electrode 120.

The loss component L4 includes the loss of propagating light and the loss of non-propagating light.

The loss of propagating light (hereinafter referred to as propagating light loss) is a loss due to absorption by the second electrode 120. The propagating light loss does not depend on the distance between the light emitting position 33 and the second electrode 120.

The loss of non-propagating light (hereinafter referred to as non-propagating light loss) is caused by interaction of evanescent light with electrons in the metal of the second electrode 120. This non-propagating light loss is called plasmon loss. The plasmon loss (non-propagating light loss) depends on the distance between the light emitting position 33 and the second electrode 120. As the distance between the light emitting position 33 and the second electrode 120 becomes longer, the plasmon loss becomes lower.

As shown in FIG. 2B, the external mode component L1, the substrate mode component L2, the thin film layer mode component L3, and the loss component L4 vary with e.g. the distance from the light emitting position 33 to the second electrode 120.

The light extraction efficiency of the organic electroluminescent element 100 can be improved by reducing the plasmon loss portion of the loss component L4 that cannot be extracted to the outside. The plasmon loss can be reduced by lengthening the distance between the light emitting position 33 and the second electrode 120.

Thus, the organic electroluminescent element 1, 1a according to this embodiment is configured to include a second electrode 20 transmissive to light emitted from the organic light emitting layer 30. Accordingly, the plasmon loss in the second electrode 20 can be reduced.

Furthermore, the optical buffer layer 40 is provided between the second electrode 20 and the reflective layer 50. Thus, the distance between the light emitting position 33 and the reflective layer 50 can be lengthened. Accordingly, the plasmon loss in the reflective layer 50 can be reduced.

Next, the refractive index of the optical buffer layer 40 and the thickness dimension of the optical buffer layer 40 mentioned above are further described.

Figure 3:
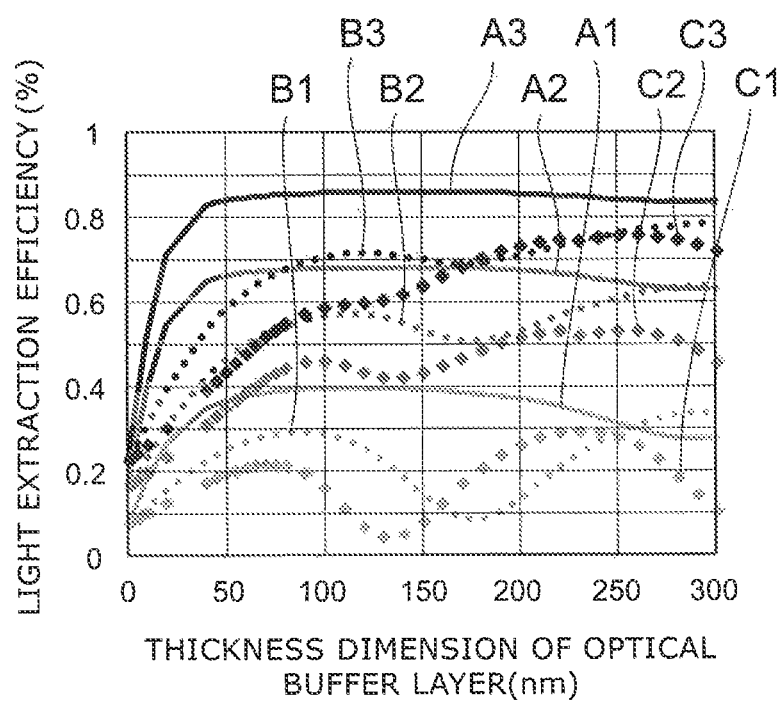
FIG. 3 is a graph illustrating the light extraction efficiency in the organic electroluminescent element 1, 1a according to the first embodiment.

FIG. 3 is a graph illustrating the light extraction efficiency in the organic electroluminescent element 1, 1a according to the first embodiment.

The horizontal axis of FIG. 3 represents the thickness dimension of the portion of the optical buffer layer 40 not provided with the light extraction portion 80 (the distance between the second electrode 20 and the reflective layer 50). The vertical axis of FIG. 3 represents the light extraction efficiency.

FIG. 3 shows an example simulation result for light extraction efficiency.

The condition of the simulation was set as follows. The first electrode 10 was assumed to be made of ITO. The thickness dimension of the first electrode 10 was set to 110 nanometers (nm). For the organic light emitting layer 30, the refractive index was set to 1.8, and the thickness dimension was set to 120 nanometers (nm). The second electrode 20 was assumed to be made of Ag. The thickness dimension of the second electrode 20 was set to 5 nanometers (nm). The reflective layer 50 was assumed to be made of Ag. The thickness dimension of the reflective layer 50 was set to 150 nanometers (nm). The wavelength of light generated at the light emitting position 33 in the organic light emitting layer 30 was set to 525 nanometers (nm). The refractive index of the substrate 60 was set to 1.5. Then, the refractive index of the optical buffer layer 40 was set to 1.0, 1.5, and 1.8, and the light extraction efficiency for each case was determined.

A1, B1, and C1 in FIG. 3 represent the external mode component L1. A1 represents the case where the refractive index of the optical buffer layer 40 is set to 1.0. B1 represents the case where the refractive index of the optical buffer layer 40 is set to 1.5. C1 represents the case where the refractive index of the optical buffer layer 40 is set to 1.8.

A2, B2, and C2 in FIG. 3 represent the sum of the external mode component L1 and the substrate mode component L2. A2 represents the case where the refractive index of the optical buffer layer 40 is set to 1.0. B2 represents the case where the refractive index of the optical buffer layer 40 is set to 1.5. C2 represents the case where the refractive index of the optical buffer layer 40 is set to 1.8.

A3, B3, and C3 in FIG. 3 represent the sum of the external mode component L1, the substrate mode component L2, and the thin film layer mode component L3. A3 represents the case where the refractive index of the optical buffer layer 40 is set to 1.0. B3 represents the case where the refractive index of the optical buffer layer 40 is set to 1.5. C3 represents the case where the refractive index of the optical buffer layer 40 is set to 1.8.

As seen from FIG. 3, if the refractive index of the optical buffer layer 40 is made lower, the light extraction efficiency can be improved in each of the external mode component L1, the substrate mode component L2, and the thin film layer mode component L3. In this case, the refractive index of the optical buffer layer 40 only needs to be made lower than the refractive index of the organic light emitting layer 30 (e.g., 1.8-2.2).

Furthermore, as seen from FIG. 3, if the thickness dimension of the portion of the optical buffer layer 40 not provided with the light extraction portion 80 is set to 50 nanometers (nm) or more, the light extraction efficiency can be improved in each of the external mode component L1, the substrate mode component L2, and the thin film layer mode component L3.

Next, refraction at the interfaces 40a, 40b, 40c, 40a', and 40b' is further described.

Here, refraction at the interface 40c is not related to the provision of the light extraction portion 80, and thus the description thereof is omitted.

In the case where the refractive index of the light extraction portion 80 is different from the refractive index of the optical buffer layer 40, refraction occurs due to the refractive index difference between the light extraction portion 80 and the optical buffer layer 40. This refraction acts as the function of light extraction.

Figure 4A:
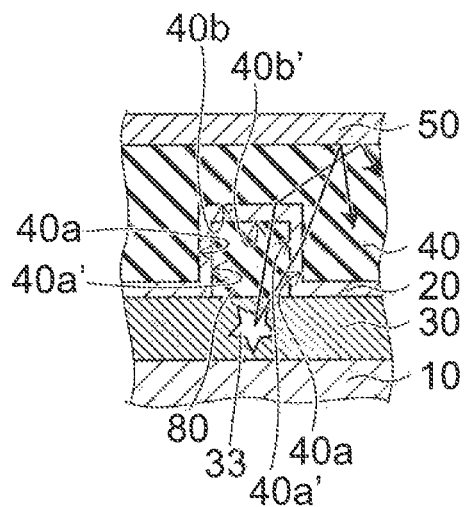
FIGS. 4A and 4B are schematic views for illustrating refraction at the interfaces 40a and 40b.
Figure 4B:
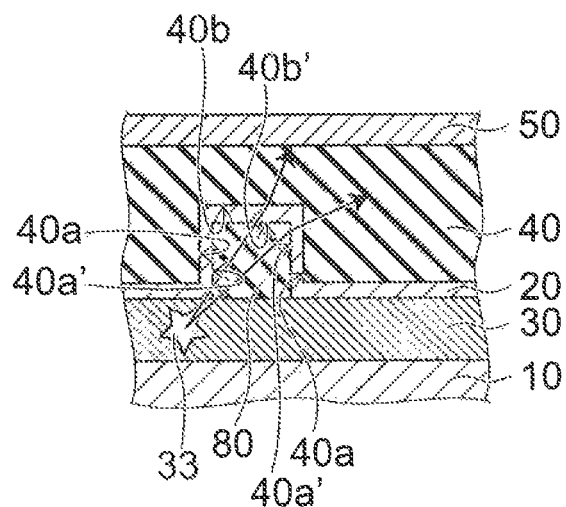

FIGS. 4A and 4B are schematic views for illustrating refraction at the interfaces 40a, 40b, 40c, 40a', and 40b'.

Here, FIG. 4A shows the case where the refractive index of the optical buffer layer 40 is lower than the refractive index of the light extraction portion 80. FIG. 4B shows the case where the refractive index of the optical buffer layer 40 is higher than the refractive index of the light extraction portion 80.

Of the optical buffer layer 40 and the light extraction portion 80, that having lower refractive index can be made of e.g. $SiO_2$, LiF, $CaF_2$, $MgF_2$, or a gas such as air, nitrogen gas, and noble gas.

As shown in FIG. 4A, in the case where the refractive index of the optical buffer layer 40 is lower than the refractive index of the light extraction portion 80, when light generated at the light emitting position 33 in the organic light emitting layer 30 is transmitted through the interface 40a', 40a, the light is refracted. By Snell's law, the angle of refraction at the interface 40a is larger than the angle of incidence on the interface 40a'. If the angle of refraction at the interface 40a is made larger, the angle of incidence on the reflective layer 50 is made smaller. Thus, the light is made more likely to be in the aforementioned external mode component L1. Accordingly, the light extraction efficiency can be improved.

On the other hand, when light generated at the light emitting position 33 in the organic light emitting layer 30 is transmitted through the interface 40b', 40b and refracted, by Snell's law, the angle of refraction at the interface 40b is larger than the angle of incidence on the interface 40b'. However, if the angle of refraction at the interface 40b is made larger, the angle of incidence on the reflective layer 50 is made larger. Thus, for the light incident on the interface 40b, the light extraction efficiency may be decreased.

That is, in the case where the refractive index of the optical buffer layer 40 is lower than the refractive index of the light extraction portion 80, preferably, the area of the interface 40a', 40a is made larger, and the area of the interface 40b', 40b is made smaller. For instance, the cross-sectional shape of the light extraction portion 80 can be such as a triangle, trapezoid, and semicircle. Alternatively, the cross-sectional shape of the light extraction section 80 may be a rectangle with the long side lying on the interface 40a', 40a side.

As shown in FIG. 4B, in the case where the refractive index of the optical buffer layer 40 is higher than the refractive index of the light extraction portion 80, when light generated at the light emitting position 33 in the organic light emitting layer 30 is transmitted through the interface 40a', 40a and refracted, the angle of refraction is made smaller. Thus, for the light incident on the interface 40a', 40a, the light extraction efficiency may be decreased.

On the other hand, when light generated at the light emitting position 33 in the organic light emitting layer 30 is transmitted through the interface 40b', 40b and refracted, the angle of refraction is made smaller. Thus, for the light incident on the interface 40b', 40b, the light extraction efficiency can be improved.

That is, in the case where the refractive index of the optical buffer layer 40 is higher than the refractive index of the light extraction portion 80, preferably, the area of the interface 40a', 40a is made smaller, and the area of the interface 40b', 40b is made larger. For instance, the cross-sectional shape of the light extraction portion 80 can be a rectangle with the long side lying on the interface 40b', 40b side.

Second Embodiment

Figure 5:
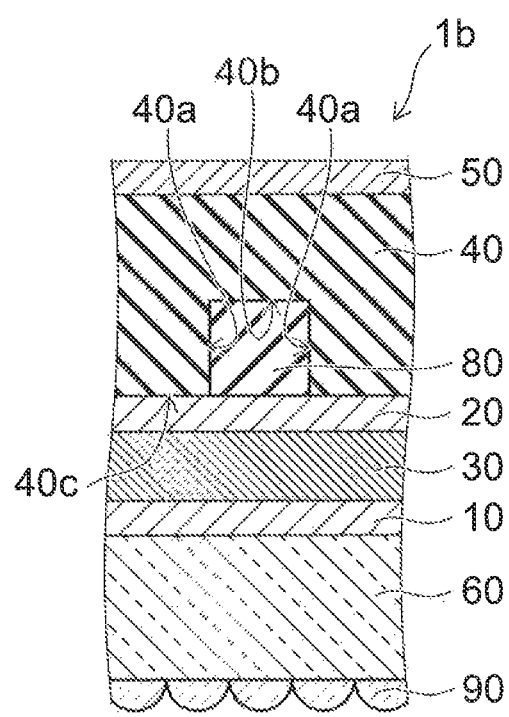
FIG. 5 is a schematic view illustrating an organic electroluminescent element 1b according to a second embodiment.

FIG. 5 is a schematic view illustrating an organic electroluminescent element 1b according to a second embodiment.

Figure 6A:
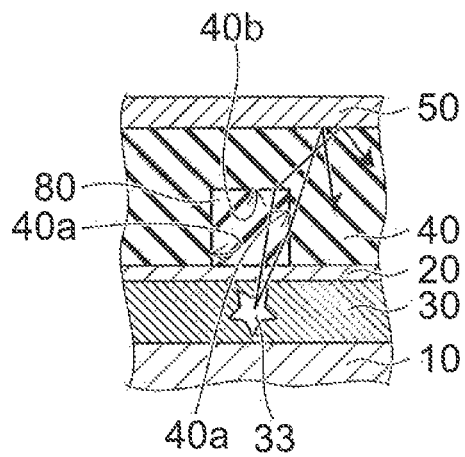
FIGS. 6A and 6B are schematic views for illustrating refraction at the interfaces 40a and 40b.
Figure 6B:
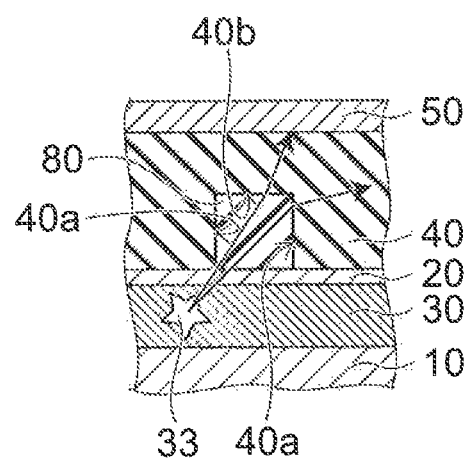

FIGS. 6A and 6B are schematic views for illustrating refraction at the interfaces 40a and 40b.

Here, FIG. 6A shows the case where the refractive index of the optical buffer layer 40 is lower than the refractive index of the light extraction portion 80. FIG. 6B shows the case where the refractive index of the optical buffer layer 40 is higher than the refractive index of the light extraction portion 80.

As shown in FIG. 5, the organic electroluminescent element 1b includes a first electrode 10, a second electrode 20, an organic light emitting layer 30, an optical buffer layer 40, a reflective layer 50, and a light extraction portion 80. Furthermore, like the aforementioned organic electroluminescent element 1a, the organic electroluminescent element 1b may further include a first functional layer 31 and a second functional layer 32. Furthermore, the organic electroluminescent element 1b may further include a substrate 60 and a microlens 90.

The light extraction portion 80 is provided in a plurality on the side provided with the second electrode 20 of the optical buffer layer 40. The light extraction portion 80 has a refractive index different from the refractive index of the optical buffer layer 40. More specifically, a plurality of light extraction portions 80 are provided between the second electrode 20 and the optical buffer layer 40. The light extraction portion 80 is projected from the side provided with the second electrode 20 of the optical buffer layer 40 into the optical buffer layer 40. Also by the provision of a plurality of light extraction portions 80 at such a position, the interfaces 40a and 40b are formed in the optical buffer layer 40.

Of the optical buffer layer 40 and the light extraction portion 80, that having lower refractive index can be configured to include such as $SiO_2$, LiF, $CaF_2$, and $MgF_2$. Alternatively, of the optical buffer layer 40 and the light extraction portion 80, that having lower refractive index can be made of a gas such as air, nitrogen gas, and noble gas.

By the provision of the light extraction portion 80, the interfaces 40a and 40b are formed. Refraction occurs at the interfaces 40a and 40b.

As shown in FIG. 6A, in the case where the refractive index of the optical buffer layer 40 is lower than the refractive index of the light extraction portion 80, when light generated at the light emitting position 33 in the organic light emitting layer 30 is refracted at the interface 40a, the angle of refraction is made larger. Thus, for the light incident on the interface 40a, the light extraction efficiency can be improved as in the foregoing.

On the other hand, when light generated at the light emitting position 33 in the organic light emitting layer 30 is refracted at the interface 40b, the angle of refraction is made larger. However, if the angle of refraction at the interface 40b is made larger, the angle of incidence on the reflective layer 50 is made larger. Thus, for the light incident on the interface 40b, the light extraction efficiency may be decreased.

That is, in the case where the refractive index of the optical buffer layer 40 is lower than the refractive index of the light extraction portion 80, preferably, the area of the interface 40a is made larger, and the area of the interface 40b is made smaller. For instance, the cross-sectional shape of the light extraction portion 80 can be such as a triangle, trapezoid, and semicircle. Alternatively, the cross-sectional shape of the light extraction portion 80 may be a rectangle with the long side lying on the interface 40a side.

As shown in FIG. 6B, in the case where the refractive index of the optical buffer layer 40 is higher than the refractive index of the light extraction portion 80, when light generated at the light emitting position 33 in the organic light emitting layer 30 is refracted at the interface 40a, the angle of refraction is made smaller. Thus, for the light incident on the interface 40a, the light extraction efficiency may be decreased.

On the other hand, when light generated at the light emitting position 33 in the organic light emitting layer 30 is refracted at the interface 40b, the angle of refraction is made smaller. Thus, for the light incident on the interface 40b, the light extraction efficiency can be improved.

That is, in the case where the refractive index of the optical buffer layer 40 is higher than the refractive index of the light extraction portion 80, preferably, the area of the interface 40a is made smaller, and the area of the interface 40b is made larger. For instance, the cross-sectional shape of the light extraction portion 80 can be a rectangle with the long side lying on the interface 40b side.

Third Embodiment

Figure 7A:
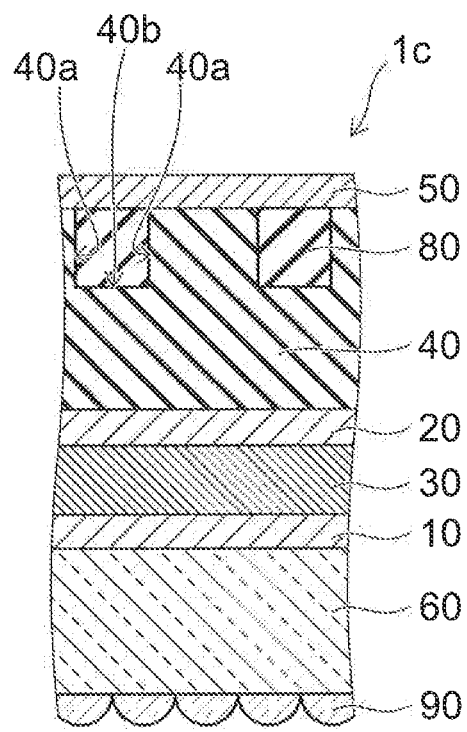
FIGS. 7A to 7C are schematic views illustrating an organic electroluminescent element 1c according to a third embodiment.
Figure 7B:
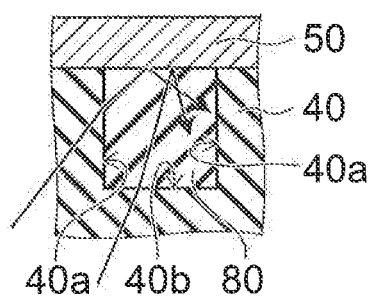
Figure 7C:
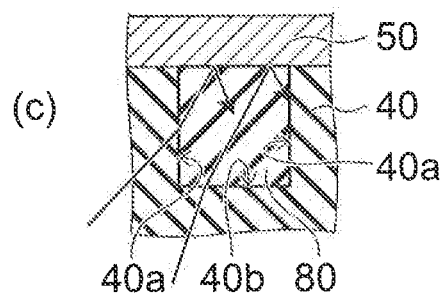

FIGS. 7A to 7C are schematic views illustrating an organic electroluminescent element 1c according to a third embodiment.

Here, FIG. 7A is a schematic cross-sectional view of the organic electroluminescent element 1c. FIG. 7B is a schematic view illustrating refraction in the case where the refractive index of the optical buffer layer 40 is lower than the refractive index of the light extraction portion 80. FIG. 7C is a schematic view illustrating refraction in the case where the refractive index of the optical buffer layer 40 is higher than the refractive index of the light extraction portion 80.

As shown in FIG. 7A, the organic electroluminescent element 1c includes a first electrode 10, a second electrode 20, an organic light emitting layer 30, an optical buffer layer 40, a reflective layer 50, and a light extraction portion 80. Furthermore, like the aforementioned organic electroluminescent element 1a, the organic electroluminescent element 1c may further include a first functional layer 31 and a second functional layer 32. Furthermore, the organic electroluminescent element 1c may further include a substrate 60 and a microlens 90.

The light extraction portion 80 is provided in a plurality on the side provided with the reflective layer 50 of the optical buffer layer 40. The light extraction portion 80 has a refractive index different from the refractive index of the optical buffer layer 40. More specifically, a plurality of light extraction portions 80 are provided between the reflective layer 50 and the optical buffer layer 40. The light extraction portion 80 is projected from the side provided with the reflective layer 50 of the optical buffer layer 40 into the optical buffer layer 40. Also by the provision of a plurality of light extraction portions 80 at such a position, interfaces 40a and 40b are formed in the optical buffer layer 40.

Of the optical buffer layer 40 and the light extraction portion 80, that having lower refractive index can be configured to include such as $SiO_2$, LiF, $CaF_2$, and $MgF_2$. Alternatively, of the optical buffer layer 40 and the light extraction portion 80, that having lower refractive index can be made of a gas such as air, nitrogen gas, and noble gas.

By the provision of the light extraction portion 80, the interfaces 40a and 40b are formed. Refraction occurs at the interfaces 40a and 40b.

As shown in FIG. 7B, in the case where the refractive index of the optical buffer layer 40 is lower than the refractive index of the light extraction portion 80, when light generated at the light emitting position 33 in the organic light emitting layer 30 is refracted at the interface 40a, the angle of refraction is made smaller.

On the other hand, when light generated at the light emitting position 33 in the organic light emitting layer 30 is refracted at the interface 40b, the angle of refraction is made smaller.

By this way, it is possible to change the traveling direction of the light by the interface 40a or the interface 40b. As a result, it is possible to improve the light extraction efficiency.

For instance, the cross-sectional shape of the light extraction portion 80 can be such as a rectangle, triangle, trapezoid, and semicircle.

As shown in FIG. 7C, in the case where the refractive index of the optical buffer layer 40 is higher than the refractive index of the light extraction portion 80, when light generated at the light emitting position 33 in the organic light emitting layer 30 is refracted at the interface 40a, the angle of refraction is made larger.

On the other hand, when light generated at the light emitting position 33 in the organic light emitting layer 30 is refracted at the interface 40b, the angle of refraction is made larger.

By this way, it is possible to change the traveling direction of the light by the interface 40a or the interface 40b. As a result, it is possible to improve the light extraction efficiency.

For instance, the cross-sectional shape of the light extraction portion 80 can be such as a rectangle, triangle, trapezoid, and semicircle.

Fourth Embodiment

Figure 8:
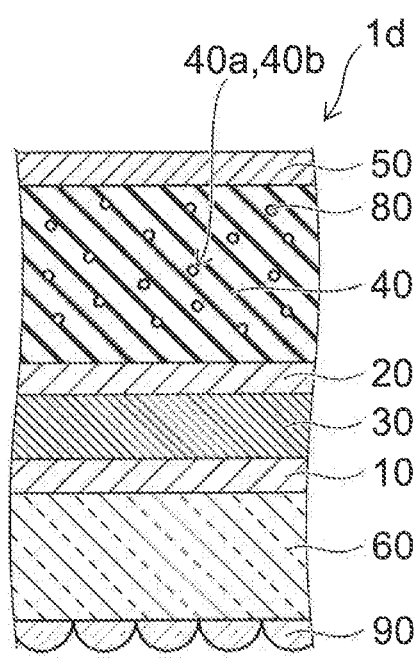
FIG. 8 is a schematic view illustrating an organic electroluminescent element 1d according to a fourth embodiment.

FIG. 8 is a schematic view illustrating an organic electroluminescent element 1d according to a fourth embodiment.

As shown in FIG. 8, the organic electroluminescent element 1d includes a first electrode 10, a second electrode 20, an organic light emitting layer 30, an optical buffer layer 40, a reflective layer 50, and a light extraction portion 80. Furthermore, like the aforementioned organic electroluminescent element 1a, the organic electroluminescent element 1d may further include a first functional layer 31 and a second functional layer 32. Furthermore, the organic electroluminescent element 1d may further include a substrate 60 and a microlens 90.

The light extraction portion 80 is provided in a plurality inside the optical buffer layer 40. The light extraction portion 80 has a refractive index different from the refractive index of the optical buffer layer 40. The plurality of light extraction portions 80 are dispersed inside the optical buffer layer 40. Also by the provision of a plurality of light extraction portions 80 in this manner, interfaces 40a and 40b are formed in the optical buffer layer 40.

Of the optical buffer layer 40 and the light extraction portion 80, that having lower refractive index can be configured to include such as $SiO_2$, LiF, $CaF_2$, and $MgF_2$. Alternatively, in the case where the refractive index of the light extraction portion 80 is made lower, the light extraction portion 80 can be made of a gas such as air, nitrogen gas, and noble gas.

By the provision of the light extraction portion 80, the interfaces 40a and 40b are formed. Refraction occurs at the interfaces 40a and 40b, Furthermore, a plurality of light extraction portions 80 being dispersed causes scattering.

In this case, refraction at the interfaces 40a and 40b is similar to that illustrated in FIGS. 7B and 7C.

If a plurality of light extraction portions 80 are dispersed inside the optical buffer layer 40, light generated at the light emitting position 33 in the organic light emitting layer 30 is scattered inside the optical buffer layer 40 and guided to the substrate 60 side.

Thus, the light extraction efficiency can be improved by refraction at the interfaces 40a and 40b and scattering by a plurality of light extraction portions 80 being dispersed.

Figure 9A:
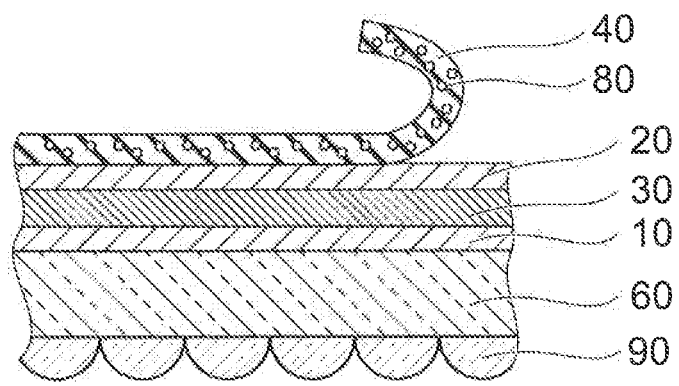
FIGS. 9A and 9B are schematic views illustrating a method for forming the optical buffer layer 40 including a plurality of light extraction portions 80.
Figure 9B:
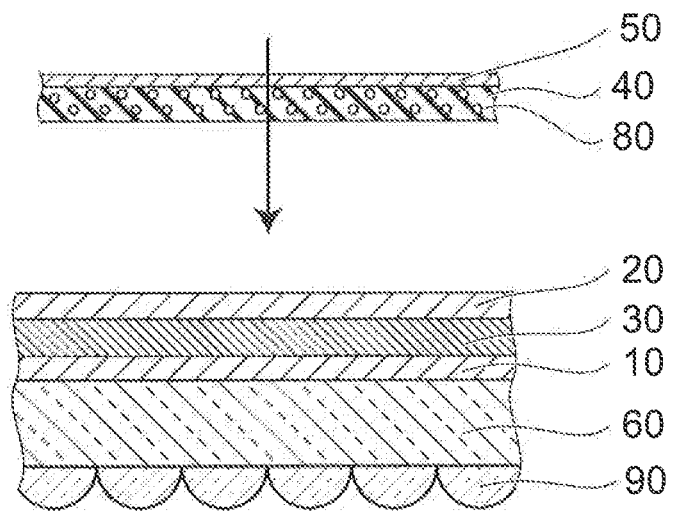

FIGS. 9A and 9B are schematic views illustrating a method for forming the optical buffer layer 40 including a plurality of light extraction portions 80.

As shown in FIG. 9A, a film-like optical buffer layer 40 dispersed with a plurality of light extraction portions 80 is formed in advance. Then, the film-like optical buffer layer 40 can be affixed to the surface of the second electrode 20 on the opposite side from the side provided with the organic light emitting layer 30.

As shown in FIG. 9B, on the surface of the reflective layer 50 on the second electrode 20 side, a film-like optical buffer layer 40 dispersed with a plurality of light extraction portions 80 is formed in advance. Then, the reflective layer 50 and the optical buffer layer 40 can be provided on the surface of the second electrode 20 on the opposite side from the side provided with the organic light emitting layer 30. Here, the optical buffer layer 40 can be formed on one surface of the reflective layer 50 by using a known evaporation technique and the like.

Fifth Embodiment

FIGS. 10A to 10E are schematic views illustrating an organic electroluminescent element 1e according to a fifth embodiment.

Figure 10A:
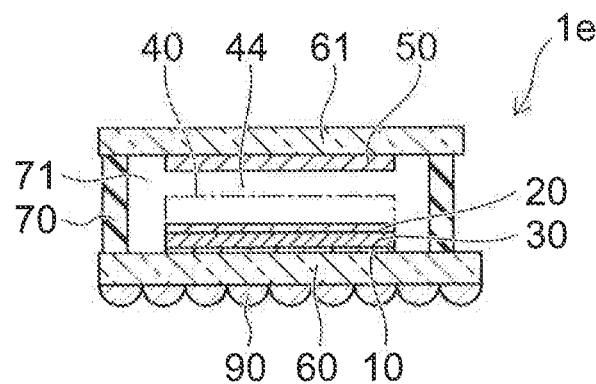
FIGS. 10A to 10E are schematic views illustrating an organic electroluminescent element 1e according to a fifth embodiment.

As shown in FIG. 10A, the organic electroluminescent element 1e includes a first electrode 10, a second electrode 20, an organic light emitting layer 30, an optical buffer layer 40, a reflective layer 50, a substrate 60, a substrate 61, and a sealing portion 70. Furthermore, like the aforementioned organic electroluminescent element 1a, the organic electroluminescent element 1e may further include a first functional layer 31 and a second functional layer 32. Furthermore, the organic electroluminescent element 1e may further include a microlens 90.

The substrate 61 is provided opposite to the substrate 60.
The substrate 61 may or may not be transmissive to light emitted from the organic light emitting layer 30.

The reflective layer 50 is provided on the surface of the substrate 61 on the side opposed to the substrate 60.

Figure 10B:
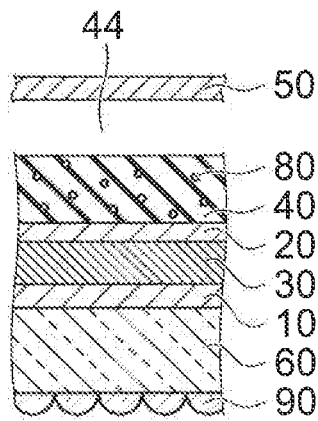
Figure 10C:
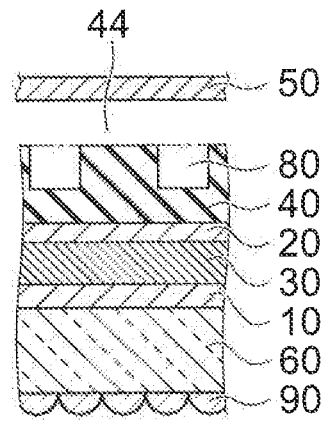

As shown in FIGS. 10B and 10C, a space 44 is provided between the reflective layer 50 and the optical buffer layer 40.

Here, FIG. 10B shows the case where, in the aforementioned organic electroluminescent element 1d, a space 44 is further provided between the reflective layer 50 and the optical buffer layer 40.

FIG. 10C shows the case where, in the aforementioned organic electroluminescent element 1c, a space 44 is further provided between the reflective layer 50 and the optical buffer layer 40.

Figure 10D:
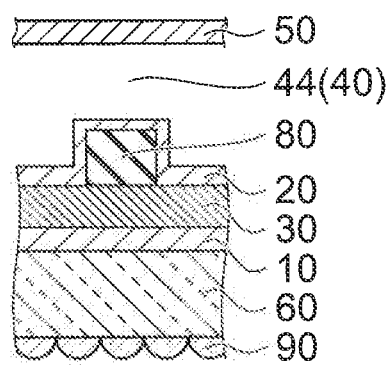
Figure 10E:
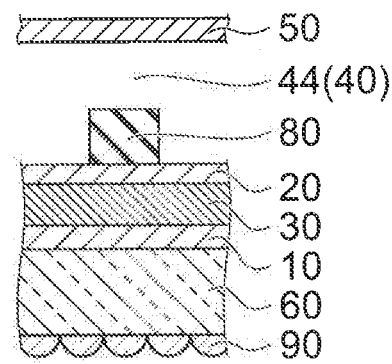

Alternatively, as shown in FIGS. 10D and 10E, a space 44 is provided between the reflective layer 50 and the second electrode 20.

Here, FIG. 10D shows the case where, in the aforementioned organic electroluminescent element 1, the optical buffer layer 40 is made of a gas filled in the space 44.

FIG. 10E shows the case where, in the aforementioned organic electroluminescent element 1b, the optical buffer layer 40 is made of a gas filled in the space 44.

As shown in FIG. 10A, one end portion side of the sealing portion 70 is provided so as to surround the periphery of the substrate 60. The other end portion side of the sealing portion 70 is provided so as to surround the periphery of the substrate 61. The sealing portion 70 is formed from e.g. a frit material. The sealing portion 70 seals the space 71 defined by the substrate 60, the substrate 61, and the sealing portion 70.

The space 71 is filled with e.g. a gas such as air, nitrogen gas, and noble gas.

Thus, the space 44 is also filled with the gas.

As described with reference to FIG. 3, if the refractive index of the optical buffer layer is made lower, the light extraction efficiency can be improved in each of the external mode component L1, the substrate mode component L2, and the thin film layer mode component L3.

In general, gas has lower refractive index than solid and liquid. Thus, the light extraction efficiency can be improved by further providing a layer made of gas between the reflective layer 50 and the optical buffer layer 40 or by making the optical buffer layer 40 itself from gas.

Here, if the reflective layer 50 is made of a dielectric multilayer film, the reflectance can be improved.

However, in general, a dielectric multilayer film is formed by using evaporation technique and the like. The temperature at the time of forming the dielectric multilayer film may reach a temperature of damaging the organic material constituting the organic electroluminescent element. Thus, if a dielectric multilayer film is formed on the surface of the optical buffer layer 40 on the opposite side from the side provided with the second electrode 20, there is a danger of damaging the optical buffer layer 40 and the like.

In the embodiment, the reflective layer 50 is provided on the substrate 61. Thus, even if the reflective layer 50 made of a dielectric multilayer film is formed by using a known evaporation technique and the like, there is no danger of damaging the optical buffer layer 40 and the like.

This enables the reflective layer 50 to be made of a dielectric multilayer film.

Sixth Embodiment

Figure 11:
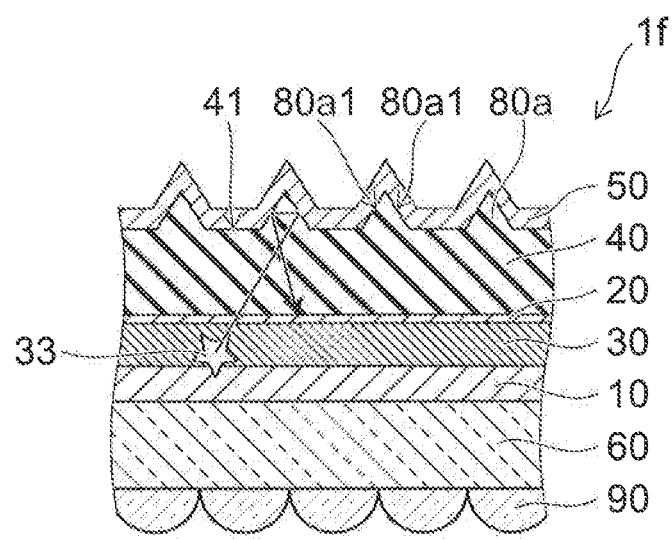
FIG. 11 is a schematic view illustrating an organic electroluminescent element 1f according to a sixth embodiment.

FIG. 11 is a schematic view illustrating an organic electroluminescent element 1f according to a sixth embodiment.

As shown in FIG. 11, the organic electroluminescent element 1f includes a first electrode 10, a second electrode 20, an organic light emitting layer 30, an optical buffer layer 40, a reflective layer 50, and a light extraction portion 80a. Furthermore, like the aforementioned organic electroluminescent element 1a, the organic electroluminescent element 1f may further include a first functional layer 31 and a second functional layer 32. Furthermore, the organic electroluminescent element 1f may further include a substrate 60 and a microlens 90.

In the aforementioned organic electroluminescent elements 1, 1a to 1e, the plurality of light extraction portions 80 are projected into the optical buffer layer 40 or dispersed inside the optical buffer layer 40.

In contrast, in the organic electroluminescent element 1f according to this embodiment, the plurality of light extraction portions 80a are projected from the surface 41 of the optical buffer layer 40 on the side provided with the reflective layer 50 toward the outside of the optical buffer layer 40. The plurality of light extraction portions 80a are spaced from each other.

The light extraction portion 80a has an inclined surface 80a1 lying along a direction crossing the extending direction of the surface of the organic light emitting layer 30 on the side provided with the second electrode 20.

In this case, preferably, the extending direction of the surface of the organic light emitting layer 30 on the side provided with the second electrode 20 is not made orthogonal to the extending direction of the inclined surface 80a1.

Furthermore, the reflective layer 50 is provided so as to cover the surface 41 of the optical buffer layer 40 and the inclined surface 80a1 of the plurality of light extraction portions 80a.

Thus, the light generated at the light emitting position 33 in the organic light emitting layer 30 and being incident on the inclined surface 80a1 of the light extraction portion 80a is reflected by the reflective layer 50 provided on the inclined surface 80a1 of the light extraction portion 80a. The light reflected by the reflective layer 50 provided on the inclined surface 80a1 of the light extraction portion 80a is made more likely to be in the aforementioned external mode component L1. As a result, the light extraction efficiency can be improved.

In the illustrated example, the cross-sectional shape of the light extraction portion 80a is a triangle. However, the cross-sectional shape is not limited thereto. For instance, the cross-sectional shape of the light extraction portion 80a can be such as a trapezoid.

In the illustrated example, the inclined surface 80a1 is a flat surface. However, the inclined surface 80a1 is not limited thereto. For instance, the inclined surface 80a1 can be such as a curved surface. In this case, the cross-sectional shape of the light extraction portion 80a can be such as a semicircle and semiellipse.

Seventh Embodiment

Figure 12:
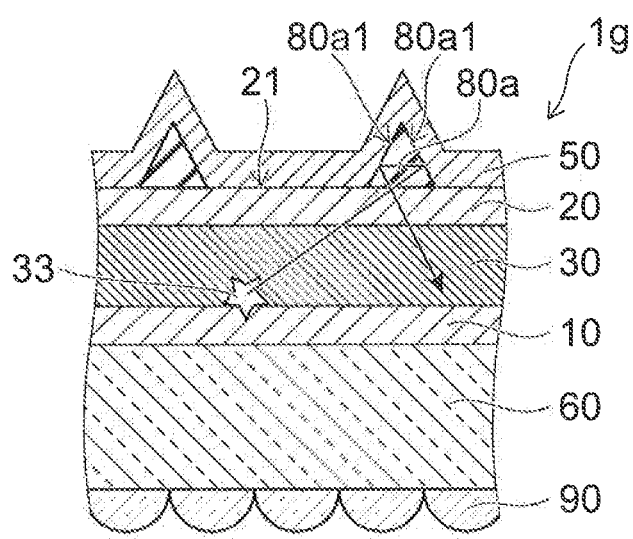
FIG. 12 is a schematic view illustrating an organic electroluminescent element 1g according to a seventh embodiment.

FIG. 12 is a schematic view illustrating an organic electroluminescent element 1g according to a seventh embodiment.

As shown in FIG. 12, the organic electroluminescent element 1g includes a first electrode 10, a second electrode 20, an organic light emitting layer 30, a reflective layer 50, and a light extraction portion 80a. Furthermore, like the aforementioned organic electroluminescent element 1a, the organic electroluminescent element 1g may further include a first functional layer 31 and a second functional layer 32. Furthermore, the organic electroluminescent element 1g may further include a substrate 60 and a microlens 90.

In the aforementioned organic electroluminescent element 1f, the plurality of light extraction portions 80a are provided on the surface 41 of the optical buffer layer 40 on the side provided with the reflective layer 50.

In contrast, in the organic electroluminescent element 1g according to this embodiment, the plurality of light extraction portions 80a are projected from the surface 21 of the second electrode 20 on the side provided with the reflective layer 50 toward the outside of the second electrode 20. The plurality of light extraction portions 80a are spaced from each other. In the organic electroluminescent element 1g, the optical buffer layer 40 is not provided. The plurality of light extraction portions 80a also play the role of the optical buffer layer 40.

Furthermore, the reflective layer 50 is provided so as to cover the surface 21 of the second electrode 20 and the inclined surface 80a1 of the plurality of light extraction portions 80a.

Thus, the light generated at the light emitting position 33 in the organic light emitting layer 30 and being incident on the inclined surface 80a1 of the light extraction portion 80a is reflected by the reflective layer 50 provided on the inclined surface 80a1 of the light extraction portion 80a. The light reflected by the reflective layer 50 provided on the inclined surface 80a1 of the light extraction portion 80a is made more likely to be in the aforementioned external mode component L1. As a result, the light extraction efficiency can be improved.

In the illustrated example, the cross-sectional shape of the light extraction portion 80a is a triangle. However, the cross-sectional shape is not limited thereto. For instance, the cross-sectional shape of the light extraction portion 80a can be such as a trapezoid.

In the illustrated example, the inclined surface 80a1 is a flat surface. However, the inclined surface 80a1 is not limited thereto. For instance, the inclined surface 80a1 can be such as a curved surface. In this case, the cross-sectional shape of the light extraction portion 80a can be such as a semicircle and semiellipse.

Furthermore, the reflective layer 50 can include a conductive material. Then, because part of the reflective layer 50 is in contact with the second electrode 20, the reflective layer 50 can be used as an auxiliary electrode.

The auxiliary electrode will be described later.

Figure 13:
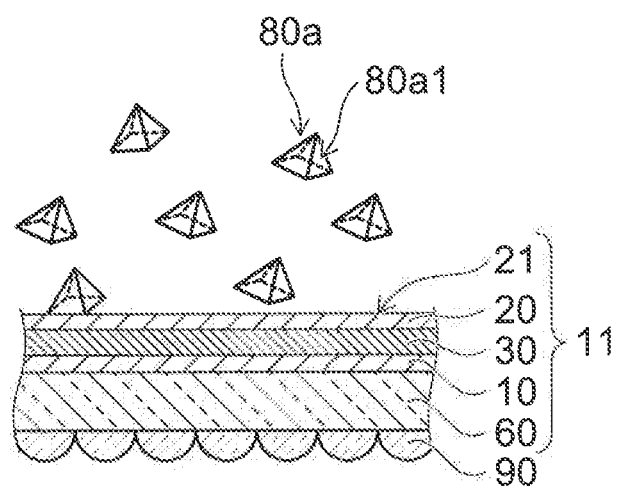

FIG. 13 is a schematic view illustrating a method for forming a plurality of light extraction portions 80a.

As shown in FIG. 13, a plurality of light extraction portions 80a are formed in advance. The plurality of light extraction portions 80a are distributed on the surface 21 of the second electrode 20 of a stacked body 11 including the second electrode 20. Then, by using a known film formation technique, a reflective layer 50 is formed so as to cover the surface 21 of the second electrode 20 and the inclined surface 80a1 of the plurality of light extraction portions 80a.

Thus, a plurality of light extraction portions 80a can be easily provided on the surface 21 of the second electrode 20.

Eighth Embodiment

Figure 14:
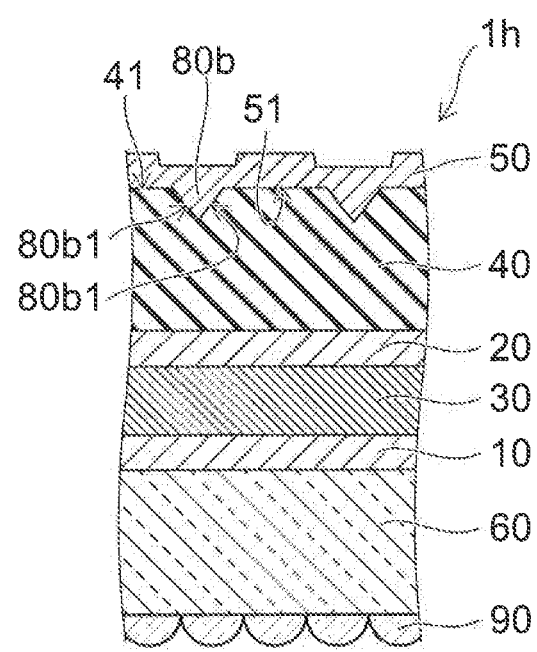
FIG. 14 is a schematic view illustrating an organic electroluminescent element 1h according to an eighth embodiment.

FIG. 14 is a schematic view illustrating an organic electroluminescent element 1h according to an eighth embodiment.

As shown in FIG. 14, the organic electroluminescent element 1h includes a first electrode 10, a second electrode 20, an organic light emitting layer 30, an optical buffer layer 40, a reflective layer 50, and a light extraction portion 80b. Furthermore, like the aforementioned organic electroluminescent element 1a, the organic electroluminescent element 1h may further include a first functional layer 31 and a second functional layer 32. Furthermore, the organic electroluminescent element 1h may further include a substrate 60 and a microlens 90.

In the aforementioned organic electroluminescent element 1g, the plurality of light extraction portions 80a are provided on the surface 21 of the second electrode 20 on the side provided with the reflective layer 50.

In contrast, in the organic electroluminescent element 1h according to this embodiment, the plurality of light extraction portions 80b are provided on the surface 51 of the reflective layer 50 on the side provided with the optical buffer layer 40. The plurality of light extraction portions 80b are projected from the surface 51 into the optical buffer layer 40. The plurality of light extraction portions 80b are spaced from each other.

The light extraction portion 80b has an inclined surface 80b1 lying along a direction crossing the extending direction of the surface of the organic light emitting layer 30 on the side provided with the second electrode 20.

In this case, preferably, the extending direction of the surface of the organic light emitting layer 30 on the side provided with the second electrode 20 is not made orthogonal to the extending direction of the inclined surface 80b1.

The plurality of light extraction portions 80b can be formed from the same material as the reflective layer 50.

The reflective layer 50 is provided so as to cover the surface 41 of the optical buffer layer 40.

The light generated at the light emitting position 33 in the organic light emitting layer 30 and being incident on the inclined surface 80b1 of the light extraction portion 80b is reflected by the inclined surface 80b1 of the light extraction portion 80b. The light reflected by the inclined surface 80b1 of the light extraction portion 80b is made more likely to be in the aforementioned external mode component L1. As a result, the light extraction efficiency can be improved.

In the illustrated example, the cross-sectional shape of the light extraction portion 80b is a triangle. However, the cross-sectional shape is not limited thereto. For instance, the cross-sectional shape of the light extraction portion 80b can be such as a trapezoid.

In the illustrated example, the inclined surface 80b1 is a flat surface. However, the inclined surface 80b1 is not limited thereto. For instance, the inclined surface 80b1 can be such as a curved surface. In this case, the cross-sectional shape of the light extraction portion 80b can be such as a semicircle and semiellipse.

Figure 15A:
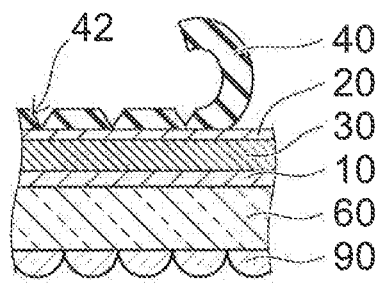
FIGS. 15A and 15B are schematic views illustrating a method for forming a plurality of light extraction portions 80b.
Figure 15B:
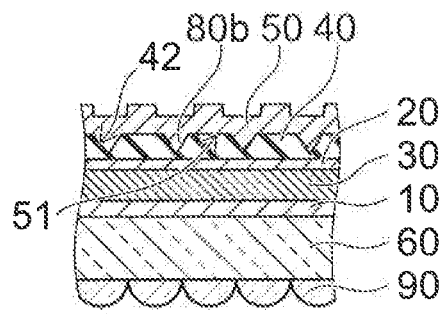
Figure 16:
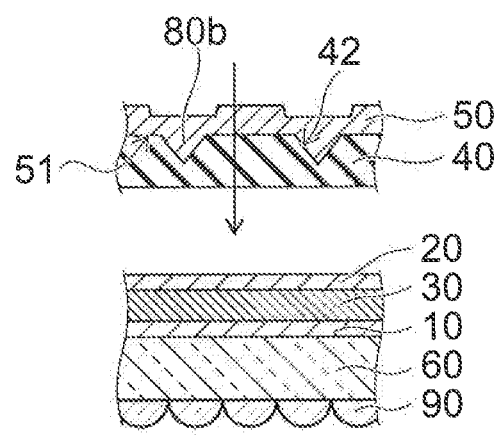
FIG. 16 is a schematic view illustrating a method for forming a plurality of light extraction portions 80b.

FIGS. 15A, 15B, and 16 are schematic views illustrating a method for forming a plurality of light extraction portions 80b.

First, as shown in FIG. 15A, a film-like optical buffer layer 40 provided with a plurality of grooves 42 for forming a plurality of light extraction portions 80b is formed in advance. Then, the film-like optical buffer layer 40 is affixed to the surface of the second electrode 20 on the opposite side from the side provided with the organic light emitting layer 30.

Next, as shown in FIG. 15B, a reflective layer 50 is formed so as to cover the surface of the optical buffer layer 40 on the side provided with the plurality of grooves 42. When the reflective layer 50 is formed, the plurality of grooves 42 are filled with the material for forming the reflective layer 50. Thus, a plurality of light extraction portions 80b can be formed. The formation of the reflective layer 50 can be performed by using a known film formation technique.

Alternatively, as shown in FIG. 16, a plurality of grooves 42 for forming a plurality of light extraction portions 80b are formed on the surface of the optical buffer layer 40 on the opposite side from the side provided with the second electrode 20. Then, a reflective layer 50 is formed so as to cover the surface of the optical buffer layer 40 on the side provided with the plurality of grooves 42. When the reflective layer 50 is formed, the plurality of grooves 42 are filled with the material for forming the reflective layer 50. Thus, a plurality of light extraction portions 80b can be formed. The formation of the reflective layer 50 can be performed by using a known film formation technique.

Then, the reflective layer 50, the plurality of light extraction portions 80b, and the optical buffer layer 40 can be provided on the surface of the second electrode 20 on the opposite side from the side provided with the organic light emitting layer 30.

By the formation method illustrated in FIGS. 15A, 15B, and 16, a plurality of light extraction portions 80b can be easily provided on the surface 51 of the reflective layer 50 on the side provided with the optical buffer layer 40.

Ninth Embodiment

Figure 17:
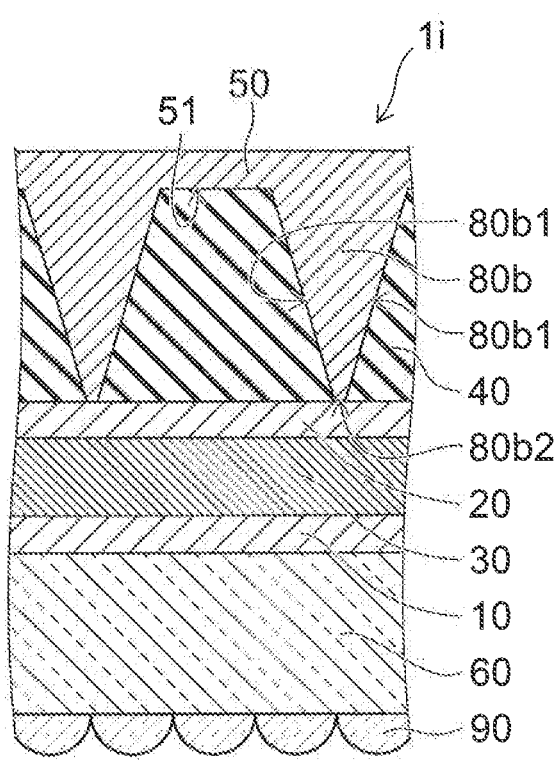
FIG. 17 is a schematic view illustrating an organic electroluminescent element 1i according to a ninth embodiment.

FIG. 17 is a schematic view illustrating an organic electroluminescent element 1i according to a ninth embodiment.

As shown in FIG. 17, the organic electroluminescent element 1i includes a first electrode 10, a second electrode 20, an organic light emitting layer 30, an optical buffer layer 40, a reflective layer 50 containing a conductive material, and a light extraction portion 80b containing a conductive material. Furthermore, like the aforementioned organic electroluminescent element 1a, the organic electroluminescent element 1i may further include a first functional layer 31 and a second functional layer 32. Furthermore, the organic electroluminescent element 1i may further include a substrate 60 and a microlens 90.

In the aforementioned organic electroluminescent element 1h, the plurality of light extraction portions 80b are provided on the surface 51 of the reflective layer 50 on the side provided with the optical buffer layer 40. In this case, the plurality of light extraction portions 80b are provided on the reflective layer 50 side of the optical buffer layer 40.

In contrast, in the organic electroluminescent element 1i according to this embodiment, the tip portion 80b2 of the light extraction portion 80b reaches the second electrode 20. That is, the reflective layer 50 and the second electrode 20 are electrically connected via the light extraction portion 80b. Thus, the reflective layer 50 can be used as an auxiliary electrode.

There are cases where the second electrode 20 cannot be configured to have sufficiently low electrical resistance. If the second electrode 20 has high electrical resistance, a large potential difference may occur between the near side and the far side with respect to the portion connected to the external power supply. If a large potential difference occurs between the near side and the far side with respect to the portion connected to the external power supply, brightness unevenness may occur.

In the embodiment, the reflective layer 50 can be used as an auxiliary electrode. This can decrease the potential difference between the near side and the far side with respect to the portion connected to the external power supply. Thus, brightness unevenness can be suppressed.

In the example illustrated in FIG. 17, the tip portion 80b2 of each light extraction portion 80b reaches the second electrode 20. However, the embodiment is not limited thereto. The embodiment may be configured so that the tip portion 80b2 of the light extraction portion 80b provided in the region where brightness unevenness may occur reaches the second electrode 20.

Furthermore, the aforementioned organic electroluminescent elements 1, 1a-1f, for instance, can be configured so that the reflective layer 50 contains a conductive material and is partly in contact with the second electrode 20. For instance, a columnar conductor may be provided between the reflective layer 50 and the second electrode 20 to electrically connect the reflective layer 50 and the second electrode 20.

Tenth Embodiment

Figure 18:
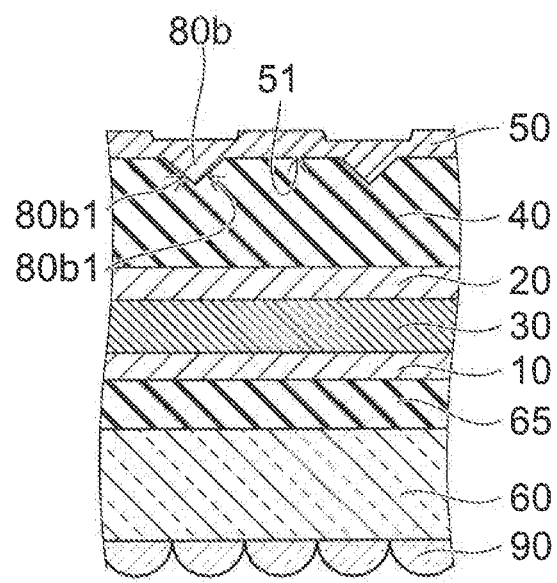
FIG. 18 is a schematic view illustrating an organic electroluminescent element 1j according to a tenth embodiment.

FIG. 18 is a schematic view illustrating an organic electroluminescent element 1j according to a tenth embodiment.

Figure 19A:
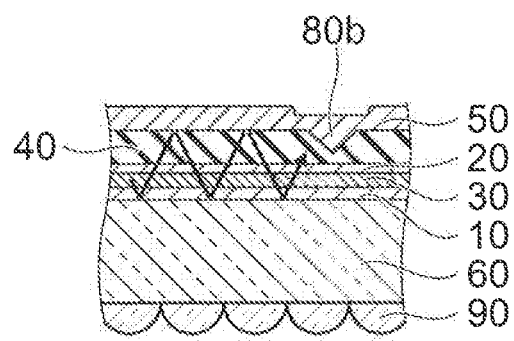
FIGS. 19A and 19B are schematic views for illustrating the function of the optical path control layer 65.
Figure 19B:
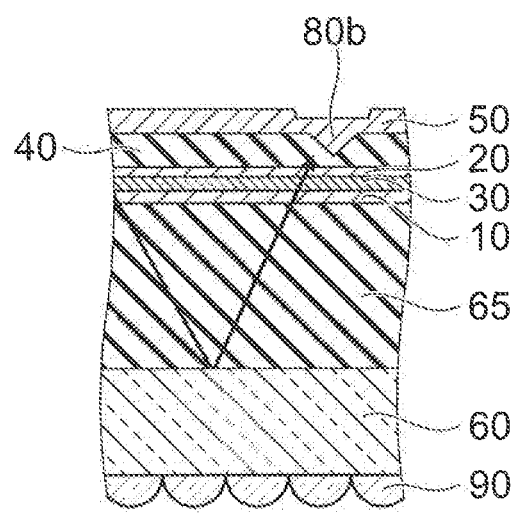

FIGS. 19A and 19B are schematic views for illustrating the function of the optical path control layer 65.

Here, FIG. 19A is a schematic view for illustrating the case where the optical path control layer 65 is not provided. FIG. 19B is a schematic view for illustrating the case where the optical path control layer 65 is provided.

As shown in FIG. 18, the organic electroluminescent element 1j includes a first electrode 10, a second electrode 20, an organic light emitting layer 30, an optical buffer layer 40, a reflective layer 50, a light extraction portion 80b, and an optical path control layer 65. Furthermore, like the aforementioned organic electroluminescent element 1a, the organic electroluminescent element 1j may further include a first functional layer 31 and a second functional layer 32. Furthermore, the organic electroluminescent element 1j may further include a substrate 60 and a microlens 90.

That is, the organic electroluminescent element 1j is different from the aforementioned organic electroluminescent element 1h in that the optical path control layer 65 is further provided between the first electrode 10 and the substrate 60.

As shown in FIG. 19A, in the case where the optical path control layer 65 is not provided, light propagates while being reflected between the substrate 60 and the reflective layer 50.

As shown in FIG. 19B, also in the case where the optical path control layer 65 is provided, light propagates while being reflected between the substrate 60 and the reflective layer 50, However, in the case where the optical path control layer 65 is provided, the distance between the substrate 60 and the reflective layer 50 is lengthened by the amount of the thickness dimension of the optical path control layer 65. This can decrease the number of times of reflection between the substrate 60 and the reflective layer 50. If the number of times of reflection can be decreased, loss due to reflection can be reduced. As a result, the light extraction efficiency can be improved.

The optical path control layer 65 is transmissive to light emitted from the organic light emitting layer 30.

The material of the optical path control layer 65 is not particularly limited as long as it is transmissive to light emitted from the organic light emitting layer 30. However, the refractive index of the optical path control layer 65 is preferably made higher than the refractive index of the organic light emitting layer 30.

The thickness dimension of the optical path control layer 65 can be appropriately set depending on the thickness dimension, refractive index and the like of the layers provided between the substrate 60 and the reflective layer 50.

In the example illustrated in FIG. 18, the optical path control layer 65 is provided in the aforementioned organic electroluminescent element 1h. However, the embodiment is not limited thereto. The optical path control layer 65 can be provided also in e.g. the aforementioned organic electroluminescent elements 1, 1a to 1g, and 1i.

Figure 20:
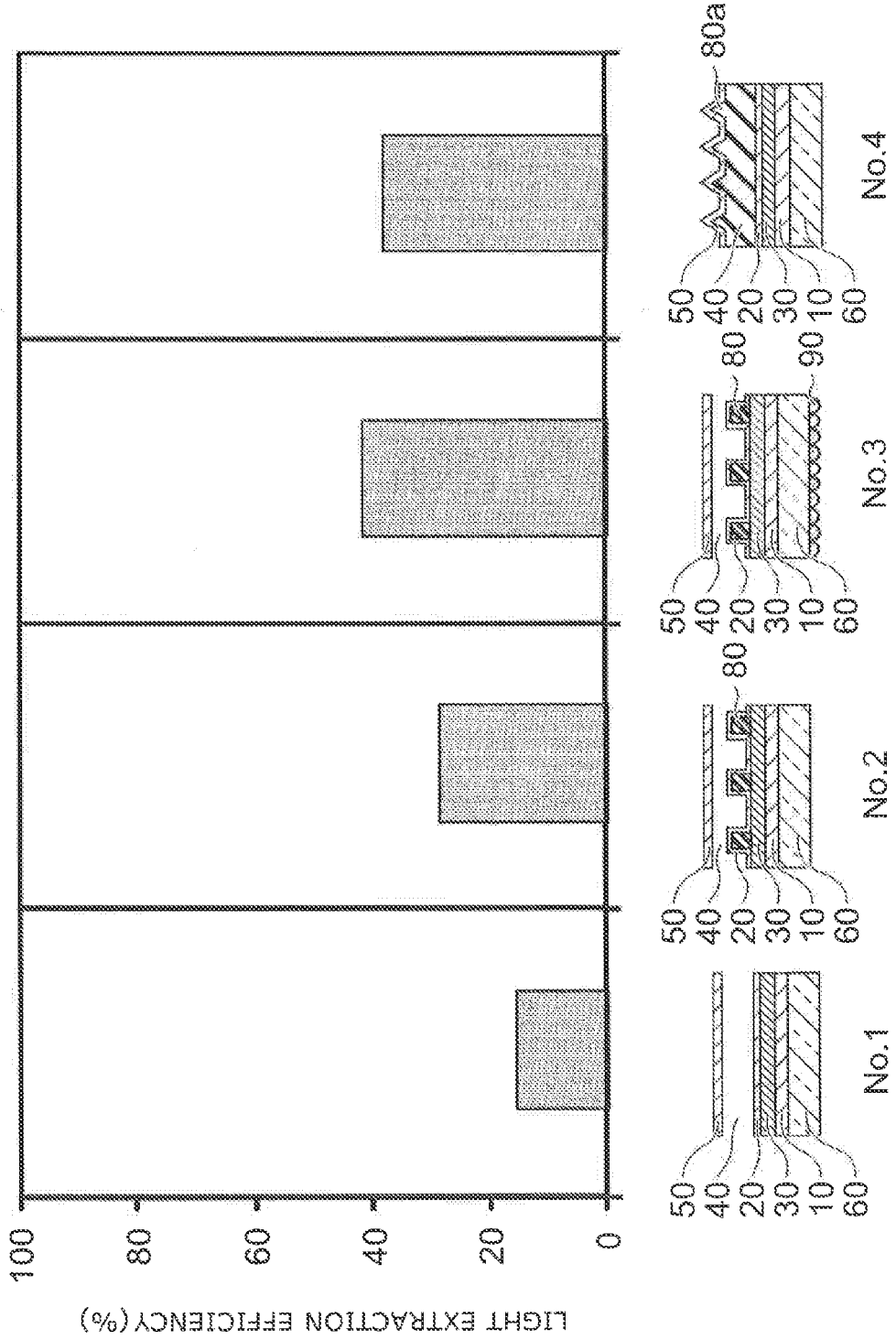
FIG. 20 is a graph for illustrating the light extraction efficiency.

FIG. 20 is a graph for illustrating the light extraction efficiency.

FIG. 20 shows an example simulation result for the light extraction efficiency in the configurations shown in No. 1 to No. 4.

The vertical axis of FIG. 20 represents the light extraction efficiency.

The configuration shown in No. 1 corresponds to the case of the organic electroluminescent element according to the comparative example in which the light extraction portion 80 is not provided.

The configuration shown in No. 2 corresponds to the case of the aforementioned organic electroluminescent element 1 in which the microlens 90 is not provided.

The configuration shown in No. 3 corresponds to the case where a plurality of microlenses 90 are further provided in the configuration shown in No. 2.

The configuration shown in No. 4 corresponds to the case of the aforementioned organic electroluminescent element 1f in which the microlens 90 is not provided.

The condition of the simulation was set as follows.

For the substrate 60, the thickness dimension was set to 700 micrometers, and the refractive index was set to 1.5.

For the first electrode 10, the thickness dimension was set to 100 nanometers (nm), and the refractive index was set to 1.8.

For the organic light emitting layer 30, the thickness dimension was set to 100 nanometers (nm), and the refractive index was set to 1.8.

For the optical buffer layer 40 in No. 1 to No. 3, the thickness dimension was set to 100 micrometers, and the refractive index was set to 1.0. That is, the optical buffer layer 40 in No. 1 to No. 3 was assumed to be made of air.

For the optical buffer layer 40 in No. 4, the thickness dimension was set to 100 micrometers, and the refractive index was set to 1.8.

The thickness dimension of the second electrode 20 was set to 5 nanometers (nm).

The first electrode 10 was assumed to be made of ITO. The second electrode 20 was assumed to be made of Ag. The reflective layer 50 was assumed to be made of Ag. The wavelength of light generated at the light emitting position 33 in the organic light emitting layer 30 was set to 525 nanometers (nm).

The microlens 90 was assumed to be shaped like a hemisphere having a diameter dimension of 30 micrometers. The microlenses 90 were assumed to be hexagonally close-packed. The packing ratio is 82%.

In No. 2 and No. 3, the light extraction portion 80 was assumed to be shaped like a cube, with the length dimension of one side being 50 micrometers. The distance between the light extraction portions 80 was set to 50 micrometers. The refractive index of the light extraction portion 80 was set to 1.8. The light extraction portions 80 were arranged in a lattice.

In No. 4, the light extraction portion 80a was assumed to be shaped like a regular quadrangular pyramid, with the length dimension of one side at the base being 80 micrometers. The height dimension was set to 60 micrometers. The distance between the light extraction portions 80a was set to 80 micrometers. The refractive index of the light extraction portion 80a was set to 1.8. The light extraction portions 80a were arranged in a lattice.

As shown in No. 2 and No. 4 in FIG. 20, if the light extraction portions 80, 80a are provided, the light extraction efficiency can be improved as compared with that shown in No. 1 in which the light extraction portion is not provided.

Furthermore, as shown in No. 3 in FIG. 20, if a plurality of microlenses 90 are further provided, the light extraction efficiency can be further improved.

The organic electroluminescent elements described in the above first to tenth embodiments can be used in a light emitting device. The light emitting device including the organic electroluminescent element described in the first to tenth embodiments has high brightness. As described below, besides the light emitting unit including the organic electroluminescent element, the light emitting device may include a driving unit and a control unit.

Figure 21:
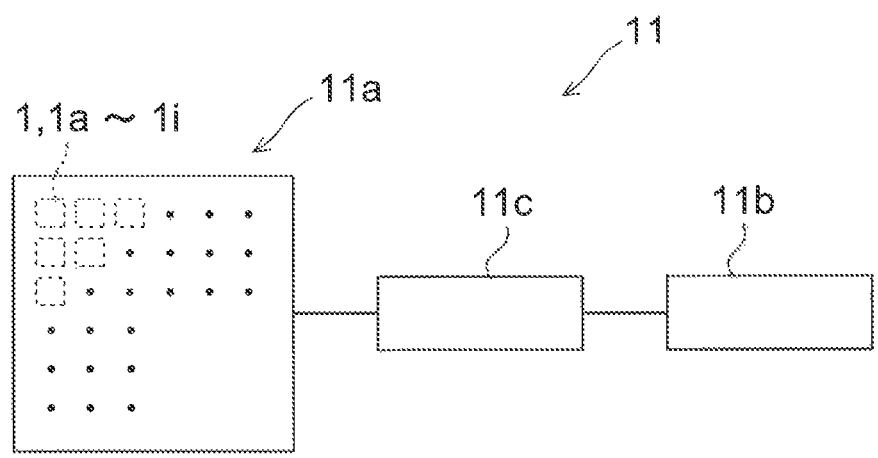
FIG. 21 is a schematic view for illustrating a light emitting device 11.

FIG. 21 is a schematic view for illustrating a light emitting device 11.

As shown in FIG. 21, the light emitting device 11 includes a light emitting unit 11a, a driving unit 11b, and a control unit 11c.

The light emitting unit 11a includes a plurality of the aforementioned organic electroluminescent elements. The arrangement of the organic electroluminescent elements is not particularly limited. For instance, as illustrated in FIG. 21, it is possible to use a regular arrangement. Alternatively, it is also possible to use a non-regular arbitrary arrangement. Furthermore, the number of organic electroluminescent elements is not limited to that illustrated, but can be appropriately changed. The number of organic electroluminescent elements may be one.

The driving unit 11b can be configured to include e.g. a driving circuit for applying a current to each organic electroluminescent element or all the organic electroluminescent elements.

For instance, in the case where the light emitting device 11 is a display device, the driving unit 11b can be configured to apply a current to each organic electroluminescent element.

Alternatively, for instance, in the case where the light emitting device 11 is an illumination device, the driving unit 11b can be configured to apply a current to all the organic electroluminescent elements.

The configuration of driving by the driving unit 11b is not limited to those illustrated, but can be appropriately changed depending on the purpose and the like of the light emitting device 11.

The control unit 11c can be configured to include e.g. a control circuit for controlling the driving unit 11b.

Here, known techniques are applicable to the components other than the aforementioned organic electroluminescent element. Thus, the detailed description on the light emitting unit 11a, the driving section 11b, and the control unit 11c is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. An organic electroluminescent element comprising:
a first electrode;
a reflective layer provided opposite to the first electrode;
an organic light emitting layer provided between the first electrode and the reflective layer;
a second electrode provided between the organic light emitting layer and the reflective layer;
an optical buffer layer provided between the second electrode and the reflective layer; and
a plurality of light extraction portions provided between the second electrode and the organic light emitting layer, the light extraction portions having a refractive index different from a refractive index of the optical buffer layer, and the plurality of light extraction portions contacting the second electrode.

2. The element according to claim 1, wherein a portion of the optical buffer layer not provided with the light extraction portion has a thickness dimension of 50 nanometers (nm) or more.

3. The element according to claim 1, wherein the refractive index of the optical buffer layer is lower than a refractive index of the organic light emitting layer.

4. The element according to claim 1, wherein of the optical buffer layer and the light extraction portions, one with a lower refractive index includes at least one selected from the group consisting of $SiO_2$, LiF, $CaF_2$, $Mgf_2$, air, nitrogen gas, and noble gas.

5. The element according to claim 1, further comprising:
an optical path control layer provided on an opposite side of the first electrode from a side provided with the organic light emitting layer, and having a higher refractive index than the organic light emitting layer.

6. The element according to claim 1, wherein the reflective layer includes a conductive material and is partly in contact with the second electrode.

7. An organic electroluminescent element comprising:
a first electrode;
a substrate provided opposite to the first electrode;
a reflective layer provided on the first electrode side of the substrate;
an organic light emitting layer provided between the first electrode and the reflective layer;
a second electrode provided between the organic light emitting layer and the reflective layer;
an optical buffer layer provided between the second electrode and the reflective layer; and
a plurality of light extraction portions provided between the optical buffer layer and the reflective layer, and the optical buffer layer being spaced from the reflective layer.

8. The element according to claim 7, wherein the light extraction portions are provided on the reflective layer side.

9. The element according to claim 7, wherein the optical buffer layer includes at least one selected from the group consisting of air, nitrogen gas, and noble gas.

10. The element according to claim 7, wherein the light extraction portions have inclined surfaces lying along a direction crossing an extending direction of a of the organic light emitting layer on a side provided with the second electrode.

11. The element according to claim 7, further comprising:
an optical path control layer provided on an opposite side of the first electrode from a side provided with the organic light emitting layer, and having a higher refractive index than the organic light emitting layer.

12. The element according to claim 7, wherein the reflective layer includes a conductive material and is partly in contact with the second electrode.

13. A light emitting device comprising:
an organic electroluminescent element including:
a first electrode;
a reflective layer provided opposite to the first electrode;
an organic light emitting layer provided between the first electrode and the reflective layer;
a second electrode provided between the organic light emitting layer and the reflective layer;
an optical buffer layer provided between the second electrode and the reflective layer; and
a plurality of light extraction portions provided between the second electrode and the organic light emitting layer, the light extraction portions having a refractive index different from a refractive index of the optical buffer layer, and the plurality of light extraction portions contacting the second electrode;
a driving unit configured to apply a current to the organic electroluminescent element; and
a control unit configured to control the driving unit.

14. An organic electroluminescent element including:
a first electrode;
a substrate provided opposite to the first electrode;
a reflective layer provided on the first electrode side of the substrate;
an organic light emitting layer provided between the first electrode and the reflective layer;
a second electrode provided between the organic light emitting layer and the reflective layer, and a space between the second electrode and the reflective layer being filled with a gas; and
a plurality of light extraction portions provided between the second electrode and the reflective layer.

* * * * *